US009673836B1

(12) United States Patent
Duale et al.

(10) Patent No.: US 9,673,836 B1
(45) Date of Patent: Jun. 6, 2017

(54) SYSTEM LEVEL TESTING OF ENTROPY ENCODING

(71) Applicant: International Business Machines Corporation, Armonk, NY (US)

(72) Inventors: Ali Y. Duale, Poughkeepsie, NY (US); Shailesh R. Gami, Poughkeepsie, NY (US); Dennis W. Wittig, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/273,806

(22) Filed: Sep. 23, 2016

(51) Int. Cl.
  *H03M 7/34*  (2006.01)
  *H03M 7/30*  (2006.01)
  *H03M 7/40*  (2006.01)

(52) U.S. Cl.
  CPC .......... *H03M 7/3088* (2013.01); *H03M 7/40* (2013.01)

(58) Field of Classification Search
  CPC ........ H03M 7/40; H03M 7/42; H03M 7/3086; H03M 7/3095; H03M 7/607; H03M 7/3093; H03M 7/6035; H04N 19/50; H04N 19/80; H04N 19/186; H04N 19/11; H04N 19/176; H04N 19/196; H04N 19/36; H04N 19/33; H04N 19/70
  USPC ................... 375/240.12, 240.02; 341/50–90
  See application file for complete search history.

(56) References Cited

U.S. PATENT DOCUMENTS

| | | | | |
|---|---|---|---|---|
| 5,471,207 A | * | 11/1995 | Zandi .................. | H03M 7/4006 341/107 |
| 6,919,826 B1 | | 7/2005 | Peacock | |
| 7,864,086 B2 | * | 1/2011 | Monro ............... | H03M 7/3082 341/107 |
| 2005/0232504 A1 | * | 10/2005 | Suzuki ................. | H04N 19/176 382/246 |
| 2006/0158355 A1 | * | 7/2006 | Jeon ..................... | H04N 19/176 341/50 |
| 2010/0281079 A1 | | 11/2010 | Marwah et al. | |
| 2014/0015698 A1 | * | 1/2014 | Shoa Hassani Lashdan ............. | H03M 7/3093 341/65 |
| 2014/0126629 A1 | * | 5/2014 | Park ................. | H04N 19/00042 375/240.02 |

(Continued)

FOREIGN PATENT DOCUMENTS

SG  152012 A1  6/2009

*Primary Examiner* — Lam T Mai
(74) *Attorney, Agent, or Firm* — Cantor Colburn LLP; Margaret A. McNamara

(57) ABSTRACT

An aspect includes receiving a symbol translation table (STT) that includes input symbols and their corresponding codewords. An entropy encoding descriptor (EED) that specifies how many of the codewords have each of the different lengths is also received. Contents of one or both of the STT and the EED are modified to generate a test case and an entropy encoding test is executed. The executing includes performing a lossless data compression process based on contents of an input data string that includes one or more of the input symbols, and on contents of the STT and the EED; or performing a data expansion process based on contents of an input data string that includes one or more of the codewords, and on contents of the STT and the EED. A result of the entropy encoding test is compared to an expected result.

20 Claims, 8 Drawing Sheets

(56) References Cited

U.S. PATENT DOCUMENTS

2014/0362904 A1\* 12/2014 Lim ..................... H04N 19/50
                                                                         375/240.02

\* cited by examiner

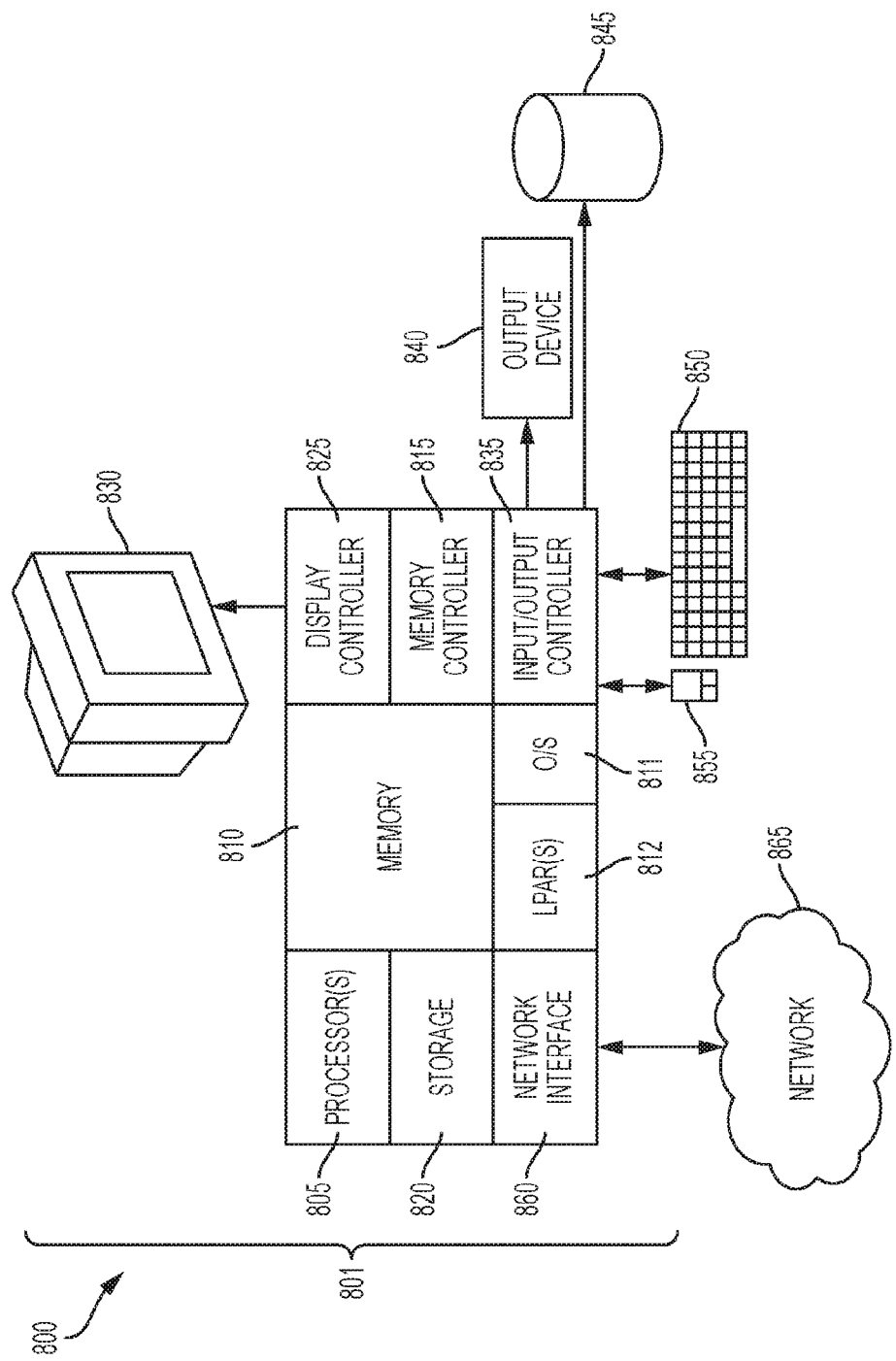

SYSTEM LEVEL TESTING OF ENTROPY ENCODING

BACKGROUND

The present invention relates generally to computer systems, and more specifically, to system level testing of entropy encoding.

In signal processing, data compression involves reducing the size of a data file by encoding information so that it uses fewer bits than an original representation of the information. Compression is performed using either lossy compression or lossless compression. Lossless compression reduces bits by identifying and eliminating statistical redundancy, and no information is lost when lossless compression is performed. In contrast, lossy compression reduces bits by removing unnecessary, or less important, information, and these bits can be lost when lossy compression is performed. Data compression is useful because it reduces resources required to store and transmit data. Computational resources are consumed in the compression process and, usually, in the reversal of the compression process (expansion). The design of a data compression scheme involves trade-offs among various factors, such as the degree of compression, the amount of distortion introduced (when using lossy data compression), and the computational resources required to compress and expand the data.

Huffman and Lempel-Ziv are two types of lossless compression algorithms. Huffman encoding is a type of entropy encoding that creates and assigns a unique prefix-free code to each unique symbol that occurs in the input data. The term "entropy encoding" is used to refer to lossless data compression schemes that are independent of the specific characteristics of the medium storing the data. Huffman encoding is used to compress data by replacing each fixed-length input symbol in the input data with a corresponding prefix-free code. The prefix-free codes are of different lengths with the most common symbols in the input data being assigned the shortest codes. The basic idea in Huffman encoding is to assign short codewords to those input blocks with high probabilities of occurring and long codewords to those with low probabilities of occurring. The design of the Huffman code is optimal for a fixed block length assuming that the source statistics are known a priori.

Lempel-Ziv compression algorithms are used to implement variable-to-fixed length codes. The basic idea of Lempel-Ziv is to parse an input sequence of data into non-overlapping blocks of different lengths while constructing a dictionary of blocks seen thus far. In contrast to a Huffman code which relies on estimates about frequencies of symbols in the input data, a Lempel-Ziv code is not designed for input data having any particular content but for a large class of sources.

SUMMARY

Embodiments include a method, system, and computer program product for system level testing of entropy encoding. A method includes receiving a symbol translation table (STT) that includes input symbols and their corresponding unique codewords of various lengths. An entropy encoding descriptor (EED) that specifies how many of the codewords have each of the different lengths is also received. Contents of one or both of the STT and the EED are modified to generate a test case and an entropy encoding test is executed. The executing includes: based on the entropy encoding test being a data compression test, performing a lossless data compression process based on contents of an input data string that includes one or more of the input symbols, and on contents of the STT and the EED; and based on the entropy encoding test being a data expansion test, performing a data expansion process based on contents of an input data string that includes one or more of the codewords, and contents of the STT and the EED. A result of the entropy encoding test is compared to an expected result, and the result of the comparing is output.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 8 illustrates a computer system for system level testing of entropy encoding in accordance with one or more embodiments.

DETAILED DESCRIPTION

Embodiments described herein provide system level testing of entropy encoding in a computer system that implements two levels of compression. One or more embodiments provide a method of testing a two-level compression process and its corresponding expansion using pseudo-random test generation. The two-level compression/expansion processes can include a Lempel-Ziv type code as the first level and an entropy code based on Huffman compression techniques as the second level. In accordance with one or more embodiments, compression and expansion are the two main components for testing entropy encoding. For compression, a Huffman tree is generated based on input data for all possible combinations and a symbol translation table (STT) with left aligned codewords is built. In addition, an entropy encoding descriptor (EED) that defines the Huffman tree including an indication of the number of bits in the STT (used during compression) and the number of input bits used for symbol indexing (used during expansion) is generated. In accordance with one or more embodiments, a variety of codewords, including invalid codewords, are built by manipulating the STT and/or the EED. In this manner, data exception cases can be generated and tested, and the process can build up to a maximum length of symbols and hence a maximum Huffman tree. A similar approach can be used for expansion where the Huffman tree is built based on the input data, and the EED is used for finding the number of input bits to be consumed for symbol indexing. In accordance with one or more embodiments, minimum changes are required to existing compression and expansion code of a device under test to perform system level testing of entropy encoding. By manipulating a previously generated STT and EED, many derivative test cases can be generated for system level testing of entropy encoding without requiring the building of new Huffman trees.

Figure 1:
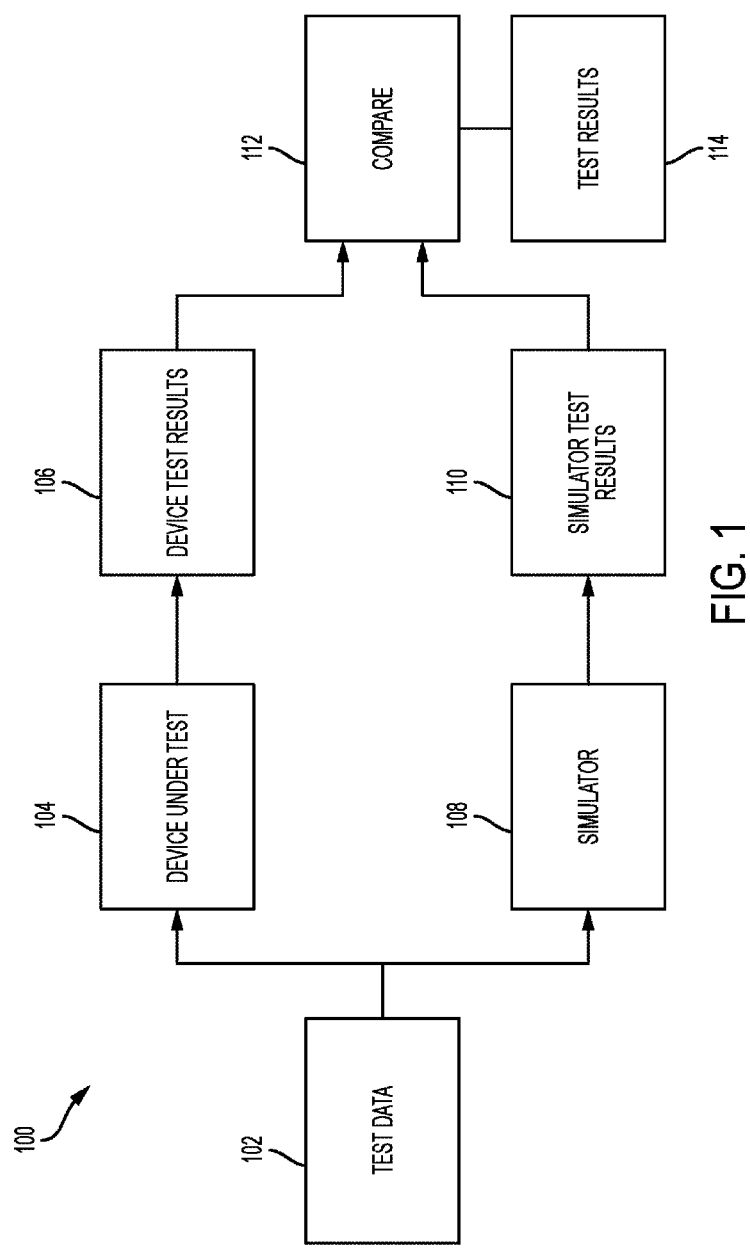
FIG. 1 illustrates a block diagram of a system for system level testing of entropy encoding in accordance with one or more embodiments.

Turning now to FIG. 1, a block diagram 100 of a system for system level testing of entropy encoding is generally shown in accordance with one or more embodiments. The block diagram 100 of FIG. 1 includes test data 102 that is input to a device under test 104 and to a simulator 108 for execution of a system level entropy encoding test. Device test results 106 are output from the device under test 104 and simulator test results 110 are output from the simulator 108 and input to compare logic 112. The results of the comparison are output as test results 114. In one or more embodiments, the test data 102 includes an input string to be compressed or expanded, a STT, and an EED. The device under test 104 can include computer systems that use any Huffman type codes for data compression such as, but not limited to a System Z® from IBM. The test results 114 can indicate whether or not the device test results 106 match the simulator test results 110 (i.e., the expected test results). In addition, the test results 114 can indicate what the differences are between the device test results 106 and the simulator test results 110, and can suggest additional tests to be performed including suggested modifications to the input string, to the EED and/or to the STT.

Figure 2:
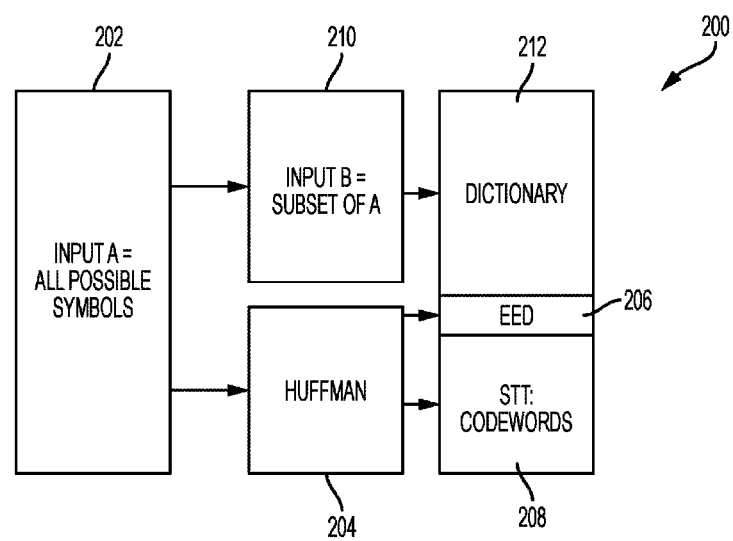
FIG. 2 illustrates a block diagram for producing an entropy encoding descriptor (EED) and a symbol translation table (STT) for use in compression testing in accordance with one or more embodiments.

Turning now to FIG. 2, a block diagram 200 for producing an EED and a STT for data compression is generally shown in accordance with one or more embodiments. Input A 202 includes all possible symbols of an input data string. For example, if the input data is text, then Input A 202 can include symbols for all of the letters in the alphabet (e.g., A to Z) and for punctuation marks. In one or more embodiments, the Huffman tree 204 is generated by building the tree based on all possible symbols. In one or more embodiments, a Huffman tree 204 could be as large as $2^{13}$ or 8,192 leaves depending on the system architecture. The EED 206 and STT 208 are built based on contents of the Huffman tree 204. In one or more embodiments, the STT 208 includes left-aligned codewords, with each entry in the STT including a 16-bit field that defines each of the possible symbols. In one or more embodiments, the EED 206 includes 16-bit elements that specify a number of leaves of each length in the Huffman tree 204. The number of leaves is the same as the length (number of bits) of a codeword. Thus, the EED 206 can be used to indicate the number of bits in the STT 208 to be used (for compression) and the number of input bits used for symbol indexing (for expansion). Also shown in FIG. 2, is Input B 210, which is a subset of Input A 202, that includes the symbols contained in the input data that is being compressed using Lempel-Ziv compression. The dictionary 212 is built by the Lempel-Ziv compression process based on the symbols contained in an input data string(s). As shown in FIG. 2, the EED 208 and STT 208 are concatenated to the end of the dictionary 212.

In accordance with one or more embodiments, the EED 208 defines the Huffman tree and is implemented by a thirty-two byte field that is located at the end of the dictionary 212. In addition, the STT 208 is located at the end of the EED 208, and each entry in the STT 208 is a sixteen bit field that defines each symbol. In accordance with one or more embodiments, the build and use of the EED 208 and STT 208 are part of testing two level compression functions. Once a valid EED 208 is built from a given Huffman tree, the contents of the EED 208 can be rearranged while keeping the EED 208 architecturally valid. For example, two or more entries of the EED 208 can be swapped, and by doing so a virtual Huffman tree is created and can be used for generating new test cases. Similarly, instead of each entry in the STT 208 representing a unique symbol, a number of entries can be modified to have the same values, and therefore create patterns of data. Another example of changes that can be made is that valid entries of an EED can be incremented or decremented to cause exceptions. The values of a given pair of entries may be changed such that their total sum stays same while each entry is modified.

Figure 3:
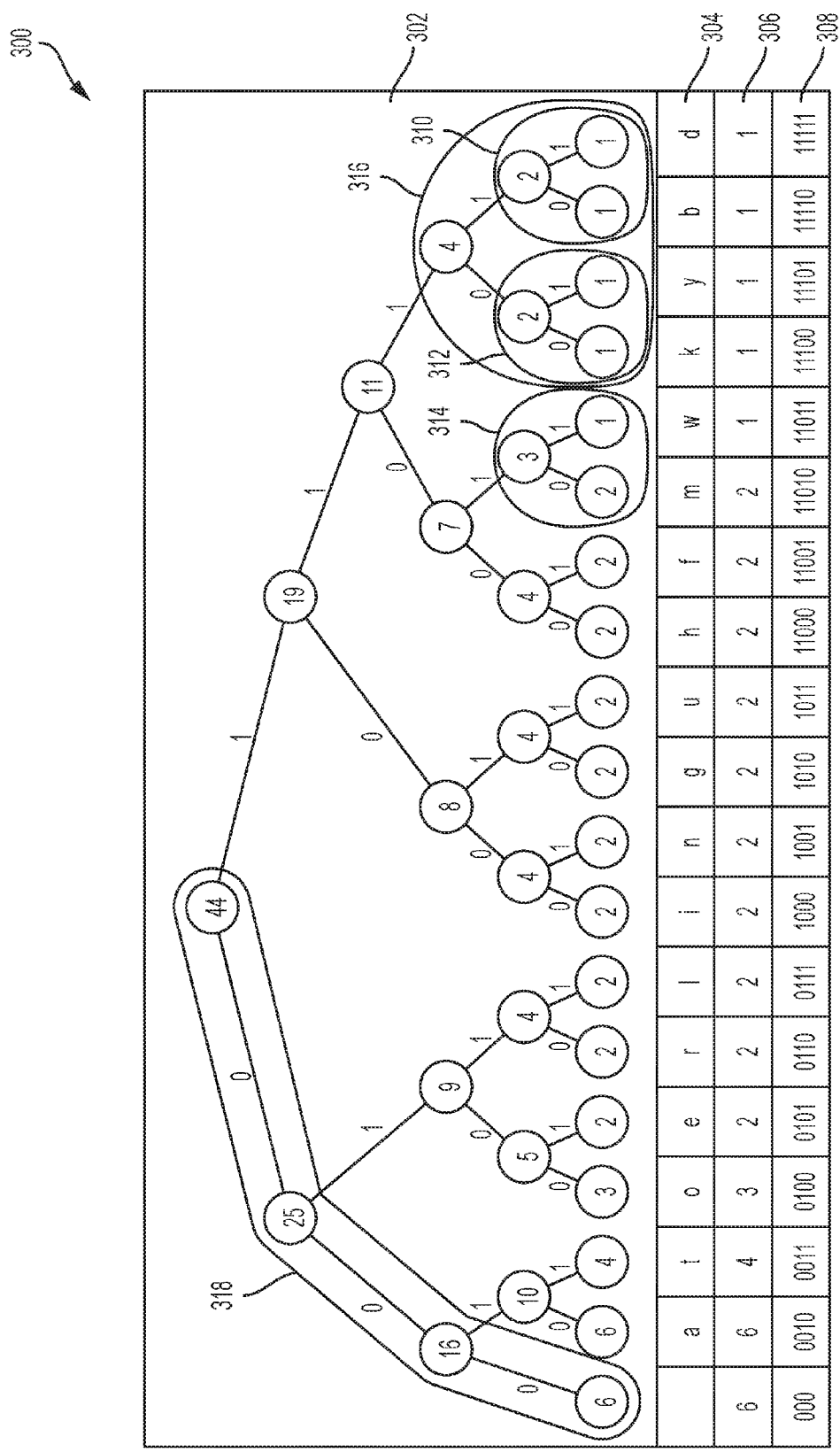
FIG. 3 illustrates a completed Huffman tree and code in accordance with one or more embodiments.

Turning now to FIG. 3, a completed Huffman tree and code 300 is generally shown in accordance with one or more embodiments. The completed Huffman tree and code 300 includes a Huffman tree 302, a list of symbols 304 in an input data string, a frequency of each of the symbols 306, and codewords 308 associated with each of the symbols 304. The example Huffman tree 302 in FIG. 3 is built based on the input data string "today we are talking about huffman algorithm." This input data string has an input data length of forty-four, with each of the symbols 304 having the corresponding frequencies 306 shown in FIG. 3. The unique symbols, or characters, are sorted based on their frequency, starting of the left with the most frequent symbols 304 ("-" or "space" and "a" with frequencies of six) and ending on the left with the least frequent symbols 304 ("w", "k", "y", "b", and "d" with frequencies of one). The bottom leaves of the Huffman tree 302 correspond to each of the symbols 304.

Building of the Huffman tree 302 shown in FIG. 3 can include merging the first two minimum frequencies ("b" with a frequency of one and "d" with a frequency of one) into a node 310 having a frequency of two. The second two minimum frequency nodes, "k" with a frequency of one and "y" with a frequency of one, are also merged into a node 312 having a frequency of two. The third minimum frequency nodes, "w" with a frequency of one and "m" with a frequency of two, are merged into a node 314 having a frequency of three. The fourth minimum frequency nodes, node 310 with a frequency of two and node 312 with a frequency of two are merged into a node 316 having a frequency of four. This process of combining minimum frequency nodes continues, resulting in the Huffman tree 302 shown in FIG. 3. In the example shown in FIG. 3, codeword bits of "0" are assigned to leaves to the left of a node and bits of "1" assigned to leaves on the right of a node. The number of leaves in the path 318 from the top of the Huffman tree to the symbol "-" (or space) is three. Thus, the length of the codeword associated with the symbol "-" is three, and in this example, the codeword assigned is "000." The compressed size after the symbols 304 are replaced with the codewords 308 is 25. In one or more embodiments, a code of zero is assigned whenever a left branch is taken and a code of one is assigned when a right branch is taken.

In accordance with one or more embodiments, each symbol 304, or character, in the input data is encoded by using strings of bits, or codewords 308, and the codewords 308 are concatenated to produce compressed data. The more frequent symbols 304 will have shorter code lengths (i.e., the corresponding codewords 308 will have fewer bits). The Huffman tree 302 is an example of a prefix-free code tree because a receiver can tell when the end of the symbol is without a special marker due to there being no valid codeword 308 in the Huffman tree 302 that is a prefix (start) of any other valid codeword in the Huffman tree 302.

In accordance with one or more embodiments, an STT corresponding to the Huffman tree 302 shown in FIG. 3 can include the following entries:

| Symbol | Codeword |
|---|---|
| — | 000 |
| A | 0010 |
| T | 0011 |
| O | 0100 |
| E | 0101 |
| R | 0110 |
| L | 0111 |
| I | 1000 |
| N | 1001 |
| G | 1010 |
| U | 1011 |
| H | 11000 |
| F | 11001 |
| M | 11010 |
| W | 11011 |
| K | 11100 |
| Y | 11101 |
| B | 11110 |
| D | 11111 |

In accordance with one or more embodiments, an EED corresponding to the Huffman tree 302 shown in FIG. 3 can include the following entries to indicate that no symbols correspond to codewords of length one or two or six through sixteen, that one symbol corresponds to a codeword of length three, that ten symbols correspond to a codeword of length four, and that eight symbols correspond to a codeword of length five:

| Number |
|---|
| 0 |
| 0 |
| 1 |
| 10 |
| 8 |
| 0 |
| 0 |
| 0 |
| 0 |
| 0 |
| 0 |
| 0 |
| 0 |
| 0 |
| 0 |
| 0 |

Figure 4:
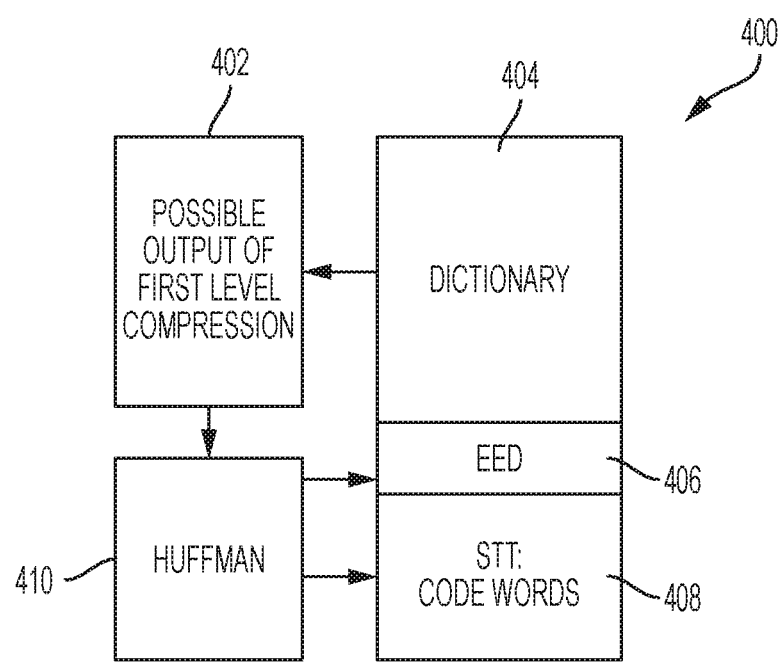
FIG. 4 illustrates a block diagram for producing an EED and a STT for use in compression testing in accordance with one or more embodiments.

Turning now to FIG. 4, a block diagram 400 for producing an EED and a STT for data compression is generally shown in accordance with one or more embodiments. As shown in FIG. 4, an EED 406 and STT 408 are built based on possible outputs from a first level of compression, such as a Lempel-Ziv compression. Input 402 includes possible outputs of the first level of compression. A dictionary 404 is built based on the first level of compression.

In accordance with one or more embodiments, the first level of compression is a Lempel-Ziv encoding algorithm that includes: initializing the dictionary 404 to contain all symbols, or strings of length one; finding the longest string "W" in the dictionary that matches the current input; emitting the dictionary index for W to output and remove W from the input; adding W followed by the next symbol in the input to the dictionary 404; repeating the finding, emitting, and adding for all symbols in the input data. In this manner, a dictionary 404 can be initialized to contain the single-character strings corresponding to all the possible input characters, and the algorithm works by scanning through the input string for successively longer substrings until it finds one that is not in the dictionary 404. When such a string is found, the index for the string without the last character (i.e., the longest substring that is in the dictionary 404) is retrieved from the dictionary 404 and sent to output, and the new string (including the last character) is added to the dictionary 404 with the next available code. The last input character is then used as the next starting point to scan for substrings. In this way, successively longer strings are registered in the dictionary 404 and made available for subsequent encoding as single output values. The algorithm works best on data with repeated patterns, so the initial parts of a message will see little compression, however as the message grows, the compression ratio increases.

In the embodiment shown in FIG. 4, the symbols produced by using the dictionary 404 (i.e., after the first level of compression is completed) are used to generate the Huffman tree. In this embodiment an input string of "abc" may be output from the Lempel-Ziv algorithm as "101010" which is input as a symbol to build the Huffman tree 410. The Huffman algorithm may then assign a codeword of "0010." Thus, an input string of "abc" which contains three symbols in the input data string, may get compressed into the codeword "0010" by the first and second level compression processes. The EED 406 and STT 408 are generated based on contents of the Huffman tree 410 and appended to the end of the dictionary 404.

Figure 5:
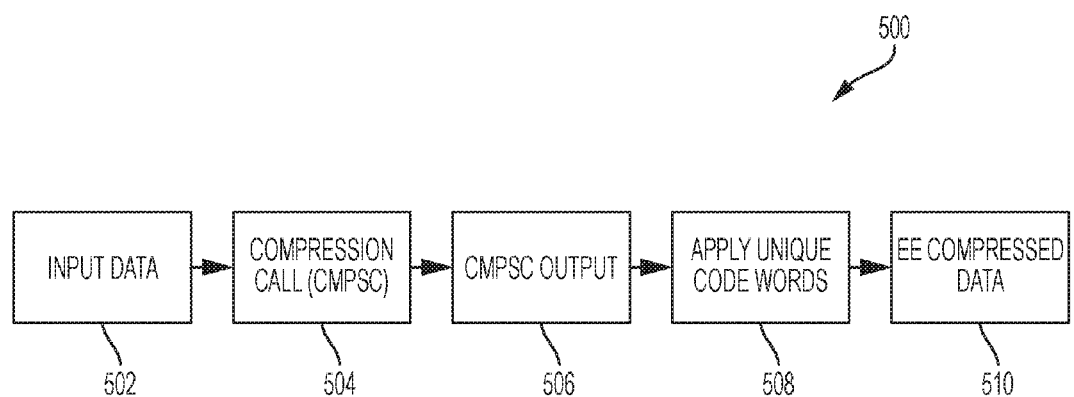
FIG. 5 illustrates a flow diagram for performing a two-level compression of input data in accordance with one or more embodiments.

Turning now to FIG. 5, a flow diagram 500 for performing a two-level compression of input data is generally shown in accordance with one or more embodiments. The flow diagram 500 shown in FIG. 5 can be performed for a single symbol with the process looping through the entire flow from block 502 to 510 for each symbol in an input data string. Alternatively, each block in the flow diagram 500 shown in FIG. 5 can be performed for a group of input symbols, such as a string of symbols or a page of symbols. At block 502 input data is received (either a group of input symbols or a single input symbol). At block 504, an IBM System Z® compression call instruction (CMPSC) or similar compression method is issued to perform the first level of compression, which in one or more embodiments is a Lempel-Ziv compression. Output 506 from the Lempel-Ziv compression (a compressed symbol or group of symbols) is used as input to the second level of compression, which in one or more embodiments is a Huffman compression algorithm. Unique code words are assigned to the input symbols at block 508 using a previously generated STT and entropy encoded compressed data is output at block 510.

Figure 6:
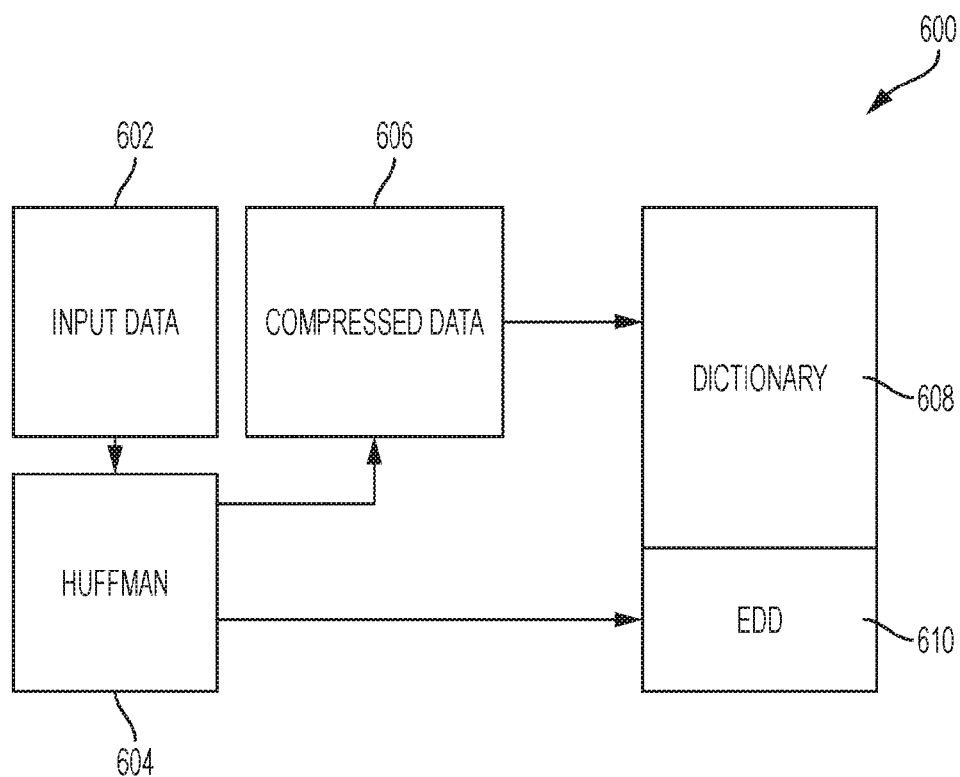
FIG. 6 illustrates a block diagram for generating expanded data in accordance with one or more embodiments.

Turning now to FIG. 6, a block diagram 600 for generating expanded data is generally shown in accordance with one or more embodiments. As shown in FIG. 6, Input Data 602 which includes compressed data, in the form of codewords for example, is input to a Huffman expansion algorithm 604 to replace the codewords with their corresponding symbols. In one or more embodiments, where two levels of compression are implemented, the symbols output from the Huffman expansion algorithm 604 is compressed data 606 that will need to be expanded by a second expansion algorithm such as a Lempel-Ziv expansion algorithm. By using the compressed data with the EED produces indices to the dictionary. As shown in FIG. 6, this can be performed by indexing a dictionary 608 to determine the original uncompressed symbol, or character, that he compressed data 606 represents.

Figure 7:
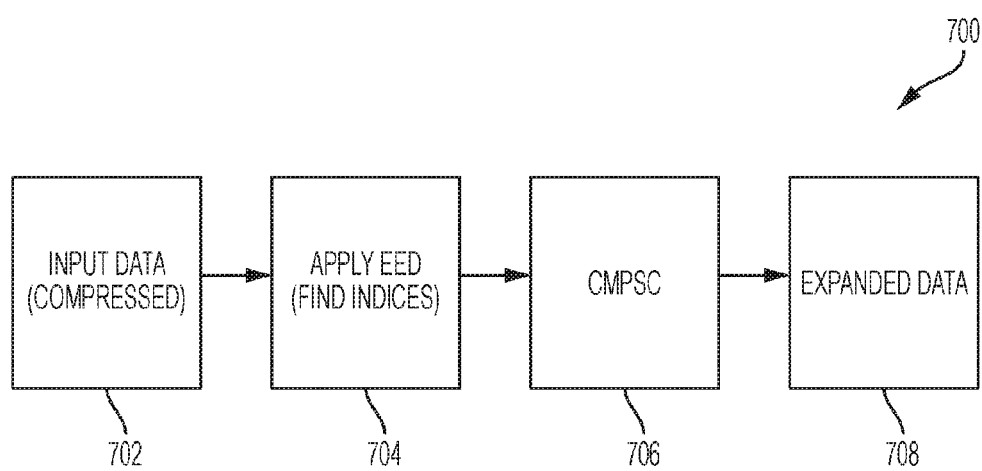
FIG. 7 illustrates a flow diagram for performing a two level expansion of compressed data in accordance with one or more embodiments.

Turning now to FIG. 7, a flow diagram 700 for performing a two-level expansion of compressed data is generally shown in accordance with one or more embodiments. The flow diagram 700 shown in FIG. 7 can be performed for a single codeword with the process looping through the entire flow from block 702 to 708 for each compressed codeword in the input data string. Alternatively, each block in the flow diagram 700 shown in FIG. 7 can be performed for a group of input symbols, such as a string of codewords or a page of codewords. At block 702 input data is received (either a group of compressed codewords or a single compressed codeword). At block 704, the EED is accessed to find an index(s) in the dictionary (generated for example by a Lempel-Ziv algorithm) that corresponds to the codeword (s). This index is input to the CMPSC at block 706 which outputs the expanded data 708 that corresponds to the index in the dictionary.

Turning now to FIG. 8, a computer system for system level testing of entropy encoding is generally shown according to one or more embodiments. The methods described herein can be implemented in hardware, software (e.g., firmware), or a combination thereof. In an exemplary embodiment, the methods described herein are implemented in hardware as part of the microprocessor of a special or general-purpose digital computer, such as a personal computer, workstation, minicomputer, or mainframe computer. The system 800 therefore may include general-purpose computer or mainframe 801 capable of running multiple instances of an O/S simultaneously.

In an exemplary embodiment, in terms of hardware architecture, as shown in FIG. 8, the computer 801 includes one or more processors 805, memory 810 coupled to a memory controller 815, and one or more input and/or output (I/O) devices 840, 845 (or peripherals) that are communicatively coupled via a local input/output controller 835. The input/output controller 835 can be, for example but not limited to, one or more buses or other wired or wireless connections, as is known in the art. The input/output controller 835 may have additional elements, which are omitted for simplicity, such as controllers, buffers (caches), drivers, repeaters, and receivers, to enable communications. Further, the local interface may include address, control, and/or data connections to enable appropriate communications among the aforementioned components. The input/output controller 835 may include a plurality of sub-channels configured to access the output devices 840 and 845. The sub-channels may include fiber-optic communications ports.

The processor 805 is a hardware device for executing software, particularly that stored in storage 820, such as cache storage, or memory 810. The processor 805 can be any custom made or commercially available processor, a central processing unit (CPU), an auxiliary processor among several processors associated with the computer 801, a semiconductor based microprocessor (in the form of a microchip or chip set), a macroprocessor, or generally any device for executing instructions.

The memory 810 can include any one or combination of volatile memory elements (e.g., random access memory (RAM, such as DRAM, SRAM, SDRAM, etc.)) and non-volatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 810 may incorporate electronic, magnetic, optical, and/or other types of storage media. Note that the memory 810 can have a distributed architecture, where various components are situated remote from one another, but can be accessed by the processor 805.

The instructions in memory 810 may include one or more separate programs, each of which comprises an ordered listing of executable instructions for implementing logical functions. In the example of FIG. 8, the instructions in the memory 810 a suitable operating system (OS) 811. The operating system 811 essentially controls the execution of other computer programs and provides scheduling, input-output control, file and data management, memory management, and communication control and related services.

The memory 810 may include multiple logical partitions (LPARs) 812, each running an instance of an operating system. The LPARs 812 may be managed by a hypervisor, which may be a program stored in memory 810 and executed by the processor 805.

In an exemplary embodiment, a conventional keyboard 850 and mouse 855 can be coupled to the input/output controller 835. Other output devices such as the I/O devices 840, 845 may include input devices, for example but not limited to a printer, a scanner, microphone, and the like. Finally, the I/O devices 840, 845 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 800 can further include a display controller 825 coupled to a display 830. In an exemplary embodiment, the system 800 can further include a network interface 860 for coupling to a network 865. The network 865 can be an IP-based network for communication between the computer 801 and any external server, client and the like via a broadband connection. The network 865 transmits and receives data between the computer 801 and external systems. In an exemplary embodiment, network 865 can be a managed IP network administered by a service provider. The network 865 may be implemented in a wireless fashion, e.g., using wireless protocols and technologies, such as WiFi, WiMax, etc. The network 865 can also be a packet-switched network such as a local area network, wide area network, metropolitan area network, Internet network, or other similar type of network environment. The network 865 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 801 is a PC, workstation, intelligent device or the like, the instructions in the memory 810 may further include a basic input output system (BIOS) (omitted for simplicity). The BIOS is a set of essential software routines that initialize and test hardware at startup, start the OS 811, and support the transfer of data among the hardware devices. The BIOS is stored in ROM so that the BIOS can be executed when the computer 801 is activated.

When the computer 801 is in operation, the processor 805 is configured to execute instructions stored within the memory 810, to communicate data to and from the memory 810, and to generally control operations of the computer 801 pursuant to the instructions.

In an exemplary embodiment, the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
receiving a symbol translation table (STT) that includes input symbols and unique codewords corresponding to each of the input symbols, at least two of the unique codewords having different lengths;
receiving an entropy encoding descriptor (EED) that specifies how many of the codewords have each of the different lengths;
modifying contents of one or both of the STT and the EED to generate a test case;
executing an entropy encoding test, the executing including:
based on the entropy encoding test being a data compression test, performing a lossless data compression process based on contents of an input data string that includes one or more of the input symbols, and on contents of the STT and the EED; and
based on the entropy encoding test being a data expansion test, performing a data expansion process based on contents of an input data string that includes one or more of the codewords, and on contents of the STT and the EED;
comparing a result of the entropy encoding test to an expected result; and
outputting a result of the comparing to a tester.

2. The method of claim 1, wherein the STT and the EED describe a Huffman tree.

3. The method of claim 2, further comprising:
generating the Huffman tree; and
generating the STT and the EED based on the Huffman tree.

4. The method of claim 1, wherein the modifying contents includes swapping one of the different lengths specified in the EED with another of the different lengths specified by the EED.

5. The method of claim 1, wherein the modifying contents includes updating the STT to include two codewords that correspond to a single input symbol.

6. The method of claim 1, wherein the modifying contents includes updating the STT to include two input signals that correspond to the same codeword.

7. The method of claim 1, wherein one or more of the input symbols correspond to output from a second lossless data compression process.

8. The method of claim 1, wherein output from the data expansion process is sent to a second data expansion process for further expansion.

9. A system comprising:
a memory having computer readable instructions; and
a processor for executing the computer readable instructions, the computer readable instructions including:
receiving a symbol translation table (STT) that includes input symbols and unique codewords corresponding to each of the input symbols, at least two of the unique codewords having different lengths;
receiving an entropy encoding descriptor (EED) that specifies how many of the codewords have each of the different lengths;
modifying contents of one or both of the STT and the EED to generate a test case;
executing an entropy encoding test, the executing including:
based on the entropy encoding test being a data compression test, performing a lossless data compression process based on contents of an input data string that includes one or more of the input symbols, and on contents of the STT and the EED; and
based on the entropy encoding test being a data expansion test, performing a data expansion process based on contents of an input data string that includes one or more of the codewords, and on contents of the STT and the EED;
comparing a result of the entropy encoding test to an expected result; and
outputting a result of the comparing to a tester.

10. The system of claim 9, wherein the STT and the EED describe a Huffman tree.

11. The system of claim 10, wherein the instructions further include:
generating the Huffman tree; and
generating the STT and the EED based on the Huffman tree.

12. The system of claim 9, wherein the modifying contents includes swapping one of the different lengths specified in the EED with another of the different lengths specified by the EED.

13. The system of claim 9, wherein the modifying contents includes updating the STT to include two codewords that correspond to a single input symbol.

14. The system of claim 9, wherein the modifying contents includes updating the STT to include two input signals that correspond to the same codeword.

15. The system of claim 9, wherein one or more of the input symbols correspond to output from a second lossless data compression process.

16. The system of claim 9, wherein output from the data expansion process is sent to a second data expansion process for further expansion.

17. A computer program product comprising a non-transitory computer readable storage medium having program instructions embodied therewith, the program instructions executable by processing circuitry to cause the processing circuitry to perform:
   receiving a symbol translation table (STT) that includes input symbols and unique codewords corresponding to each of the input symbols, at least two of the unique codewords having different lengths;
   receiving an entropy encoding descriptor (EED) that specifies how many of the codewords have each of the different lengths;
   modifying contents of one or both of the STT and the EED to generate a test case;
   executing an entropy encoding test, the executing including:
      based on the entropy encoding test being a data compression test, performing a lossless data compression process based on contents of an input data string that includes one or more of the input symbols, and on contents of the STT and the EED; and
      based on the entropy encoding test being a data expansion test, performing a data expansion process based on contents of an input data string that includes one or more of the codewords, and on contents of the STT and the EED;
   comparing a result of the entropy encoding test to an expected result; and
   outputting a result of the comparing to a tester.

18. The computer program product of claim 17, wherein the STT and the EED describe a Huffman tree.

19. The computer program product of claim 18, wherein the program instructions are further executable by processing circuitry to cause the processing circuitry to perform:
   generating the Huffman tree; and
   generating the STT and the EED based on the Huffman tree.

20. The computer program product of claim 17, wherein one or more of the input symbols correspond to output from a second lossless data compression process.

\* \* \* \* \*